United States Patent
Wada et al.

(10) Patent No.: US 12,471,224 B2
(45) Date of Patent: Nov. 11, 2025

(54) RESIN STRUCTURE

(71) Applicant: Yazaki Corporation, Tokyo (JP)

(72) Inventors: Masahiro Wada, Makinohara (JP); Takaaki Kakimi, Makinohara (JP); Kazuki Shoji, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 267 days.

(21) Appl. No.: 17/966,091

(22) Filed: Oct. 14, 2022

(65) Prior Publication Data

US 2023/0117716 A1    Apr. 20, 2023

(30) Foreign Application Priority Data

Oct. 18, 2021   (JP) ................. 2021-170386

(51) Int. Cl.
| | |
|---|---|
| *H05K 5/02* | (2006.01) |
| *B60R 16/023* | (2006.01) |
| *H05K 5/03* | (2006.01) |

(52) U.S. Cl.
CPC ............ *H05K 5/0217* (2013.01); *H05K 5/03* (2013.01); *B60R 16/0238* (2013.01); *B60R 16/0239* (2013.01)

(58) Field of Classification Search
CPC ...... H02G 3/081; H05K 5/062; H05K 5/0217; H05K 5/03; B60R 16/0238
See application file for complete search history.

(56) References Cited

U.S. PATENT DOCUMENTS

| | | | | |
|---|---|---|---|---|
| 6,545,217 B2* | 4/2003 | Sato | ................. | H02G 3/088 |
| | | | | 174/64 |
| 7,172,440 B2* | 2/2007 | Kanamaru | ........... | H01R 13/447 |
| | | | | 439/949 |
| 8,878,059 B2* | 11/2014 | Makino | ............... | B60R 16/0238 |
| | | | | 174/50 |
| 11,377,051 B2* | 7/2022 | Kurata | ................. | H02G 3/14 |
| 11,600,977 B2* | 3/2023 | Kakimi | ................. | H02G 3/081 |
| 12,046,885 B2* | 7/2024 | Mita | ................. | H02G 3/14 |
| 12,344,174 B2* | 7/2025 | Wada | ................. | H05K 5/06 |

(Continued)

FOREIGN PATENT DOCUMENTS

| | | | | |
|---|---|---|---|---|
| DE | 202012101692 U1 * | 8/2012 | ............. | B25H 3/022 |
| JP | 2020-150595 A | 9/2020 | | |

(Continued)

*Primary Examiner* — Dameon E Levi
(74) *Attorney, Agent, or Firm* — Sughrue Mion, PLLC (57) ABSTRACT

A resin structure includes a body divided into regions and a lid to cover one of the regions. The body includes a first partition wall extending in a partition direction to partition a pair of regions. The lid covers one of the pair of regions and includes a second partition wall extending along the first partition wall. The first partition wall has a protrusion at an end of the first partition wall, the protrusion protruding toward the second partition wall, and having a first inclined surface inclined in a manner gradually approaching a distal end side in the partition direction toward a distal end of the protrusion away from the first partition wall. The second partition wall has a second inclined surface inclined along the first inclined surface. The lid is to be attached to the body being guided by the second inclined surface facing the first inclined surface.

5 Claims, 9 Drawing Sheets

(56) References Cited

U.S. PATENT DOCUMENTS

| | | | | |
|---|---|---|---|---|
| 2006/0089020 A1* | 4/2006 | Kanamaru | | H01R 9/24 |
| | | | | 439/76.2 |
| 2009/0218129 A1* | 9/2009 | Taniguchi | | H02G 3/081 |
| | | | | 174/503 |
| 2014/0131061 A1* | 5/2014 | Hirasawa | | H02G 3/088 |
| | | | | 174/50 |
| 2015/0171608 A1* | 6/2015 | Ueyama | | H05K 5/0004 |
| | | | | 174/50 |
| 2020/0294749 A1 | 9/2020 | Kurata et al. | | |
| 2020/0295548 A1* | 9/2020 | Kurata | | B60R 16/0239 |
| 2021/0078513 A1 | 3/2021 | Kurata et al. | | |
| 2021/0083463 A1* | 3/2021 | Washihira | | H02G 3/086 |

FOREIGN PATENT DOCUMENTS

| | | |
|---|---|---|
| JP | 2020-150596 A | 9/2020 |
| JP | 2021-45019 A | 3/2021 |

\* cited by examiner

# RESIN STRUCTURE

CROSS-REFERENCE TO RELATED APPLICATION

The present application claims priority to Japanese Patent Application No. 2021-170386 filed on Oct. 18, 2021, the entire content of which is incorporated herein by reference.

TECHNICAL FIELD

The presently disclosed subject matter relates to a resin structure.

BACKGROUND

In related art, a resin structure configured by attaching a plurality of resin bodies to each other, such as an electric junction box (for example, a relay box) mounted on a vehicle, has been proposed. For example, one of the electric junction boxes of the related art includes a box-shaped body for storing electronic components and the like, and a lid having a shape corresponding to an opening of the body to cover the opening. The lid is attached to the body (see, for example, JP2020-150595A, JP2020-150596A, and JP2021-045019A).

Depending on the specification of the electric junction boxes, the inside of the body of the electric junction boxes may be divided into a plurality of regions, and the openings of the respective regions may be covered by using a plurality of lids corresponding to the respective regions. As an example, from the viewpoint of improving the maintainability of an electric junction boxes or the like, individual regions may be designed such that relays are mainly stored in one region and fuses are mainly stored in another region. When such an electric junction box is divided into a plurality of regions and the individual regions are covered by the lids in this way, the number of steps is increased, for it is necessary to attach the lids to the body while aligning the lids with the openings of the body. Therefore, it is difficult to improve the productivity of the electric junction box as compared with a case where the body has only a single region. Without being limited to the electric junction box, in any resin structure having a structure having a plurality of inner regions and thus a plurality of lids are to be attached to a body, it is similarly difficult to improve productivity as compared with a case where the resin structure has only a single inner region.

SUMMARY

Illustrative aspects of the presently disclosed subject matter provide a resin structure that enables a lid to be easily attached to a body having a plurality of inner regions.

In order to achieve the object described above, the resin structure according to the presently disclosed subject matter is characterized as follows.

According to an illustrative aspect of the presently disclosed subject matter, a resin structure includes a body having a box-shape and divided into a plurality of regions and a lid configured to be attached to the body and to cover one of the plurality of regions. The body includes a first partition wall extending in a partition direction to partition a pair of regions adjacent to each other of the plurality of regions. The lid is configured to cover one of the pair of regions and includes a second partition wall provided at an edge of the lid in a manner extending in the partition direction along the first partition wall. The first partition wall has a protrusion provided at an end of the first partition wall in the partition direction, the protrusion protruding toward the second partition wall and being coupled to a peripheral wall of the one of the regions, and having a first inclined surface inclined in a manner gradually approaching a distal end side in the partition direction toward a distal end of the protrusion away from the first partition wall. The second partition wall has a second inclined surface provided at an end of the second partition wall, the end corresponding to the protrusion in the partition direction, the second inclined surface inclined along the first inclined surface. When the body and the lid are being attached to each other, the lid is attached to the body while being guided by the second inclined surface facing the first inclined surface.

Other aspects and advantages of the presently disclosed subject matter will be apparent from the following description, the drawings and the claims.

DESCRIPTION OF EMBODIMENTS

Hereinafter, a resin structure 1 according to an embodiment of the presently disclosed subject matter illustrated in FIG. 1 will be described with reference to the drawings. The resin structure 1 is typically a relay box (electric junction box) that is to be mounted on a vehicle and to accommodate electronic components such as relays.

Figure 1:
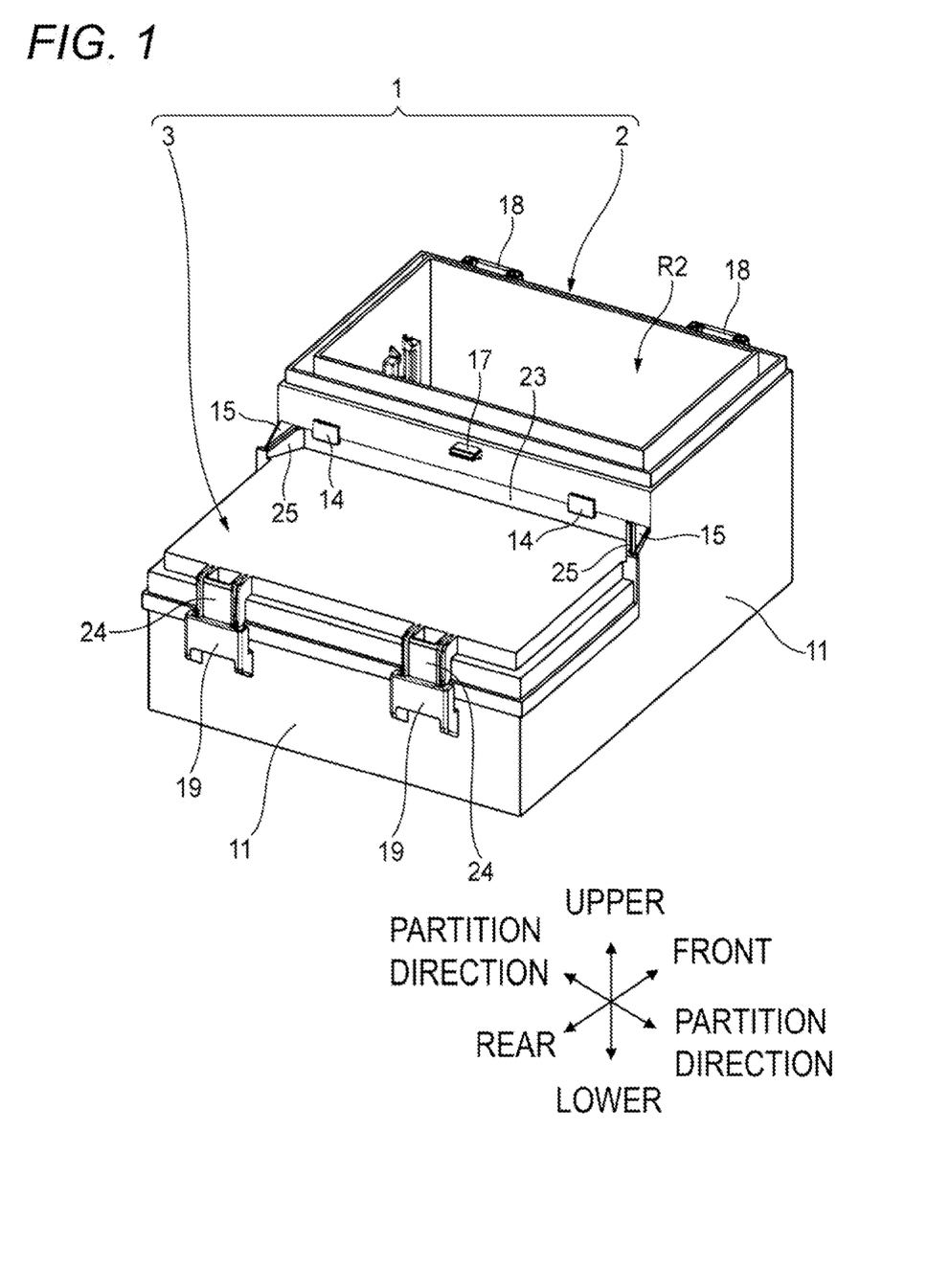
FIG. 1 is a perspective view of a resin structure according to an embodiment of the presently disclosed subject matter (a second lid is not shown in the drawings)
Figure 2:
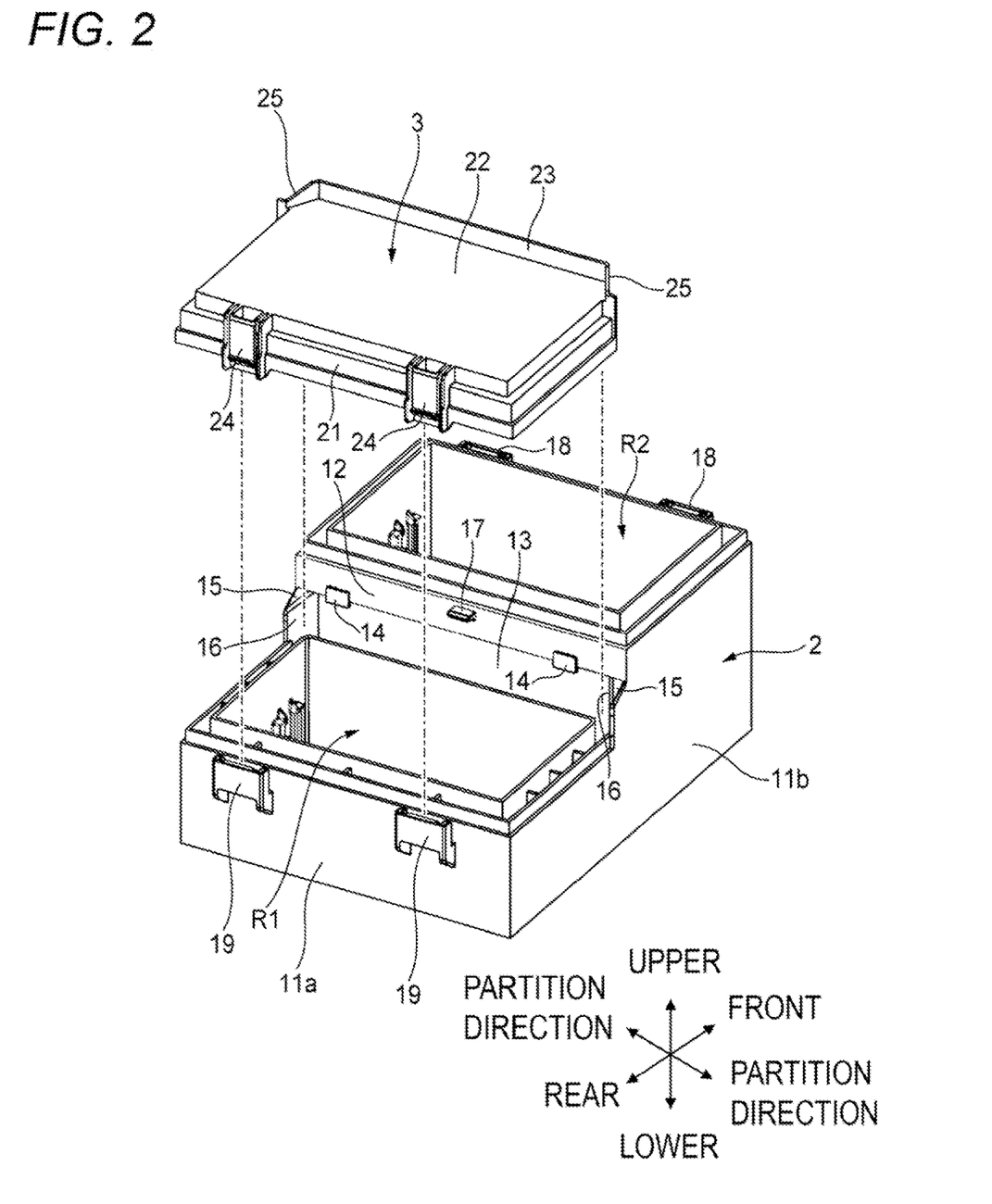
FIG. 2 is a perspective view showing a body and a first lid.

As shown in FIGS. 1 and 2, the resin structure 1 includes a body 2 to accommodate electronic components such as relays (and other components that are not shown), a first lid 3 attached to the upper end of the body 2 to cover the upper end opening of a first region R1 inside the body 2 (see FIG. 2), and a second lid (not shown) attached to the upper end of the body 2 to cover the upper end opening of a second region R2 inside the body 2 (see FIG. 2). Each of the body 2, the first lid 3, and the second lid is a resin molded body. In this example, in order to prevent interference between the first lid 3 and a component positioned above the first lid 3 (for example, a reservoir tank or the like) when mounted on the vehicle, the first lid 3 is positioned below the second lid in the attached state of the resin structure 1. Hereinafter, each member forming the resin structure 1 will be described in order.

First, the body 2 will be described. As shown in FIGS. 1 and 2, the body 2 has a tubular peripheral wall 11 having a predetermined shape when viewed in the upper-lower direction and extending in the upper-lower direction. The inside of the body 2 surrounded by the peripheral wall 11 is divided into a first region R1 and a second region R2 by a flat plate-shaped first partition wall 12 traversing the inside of the body 2 in a predetermined direction and extending in the upper-lower direction. In this example, the first region R1 and the second region R2 each accommodate electronic components such as relays (and other components, not illustrated).

Hereinafter, in the peripheral wall 11, a portion surrounding the first region R1 may be referred to as a first peripheral wall 11a, and a portion surrounding the second region R2 may be referred to as a second peripheral wall 11b (see FIG. 2). In this example, in order to position the first lid 3 below the second lid in the attached state of the resin structure 1, the upper end edge of the first peripheral wall 11a is positioned below the upper end edge of the second peripheral wall 11b and the upper end edge of the first partition wall 12.

Hereinafter, for convenience of description, as illustrated in FIGS. 1 to 9, the "partition direction", the "front-rear direction", and the "upper-lower direction" are defined. The "partition direction", the "front-rear direction", and the "upper-lower direction" are orthogonal to one another. When the resin structure 1 is mounted on the vehicle, the "upper-lower direction" corresponds to the upper-lower direction of the vehicle. The "partition direction" corresponds to the predetermined direction in which the first partition wall 12 extends the inside of the body 2, and the "front-rear direction" corresponds to the plate thickness direction of the first partition wall 12.

Figure 8:
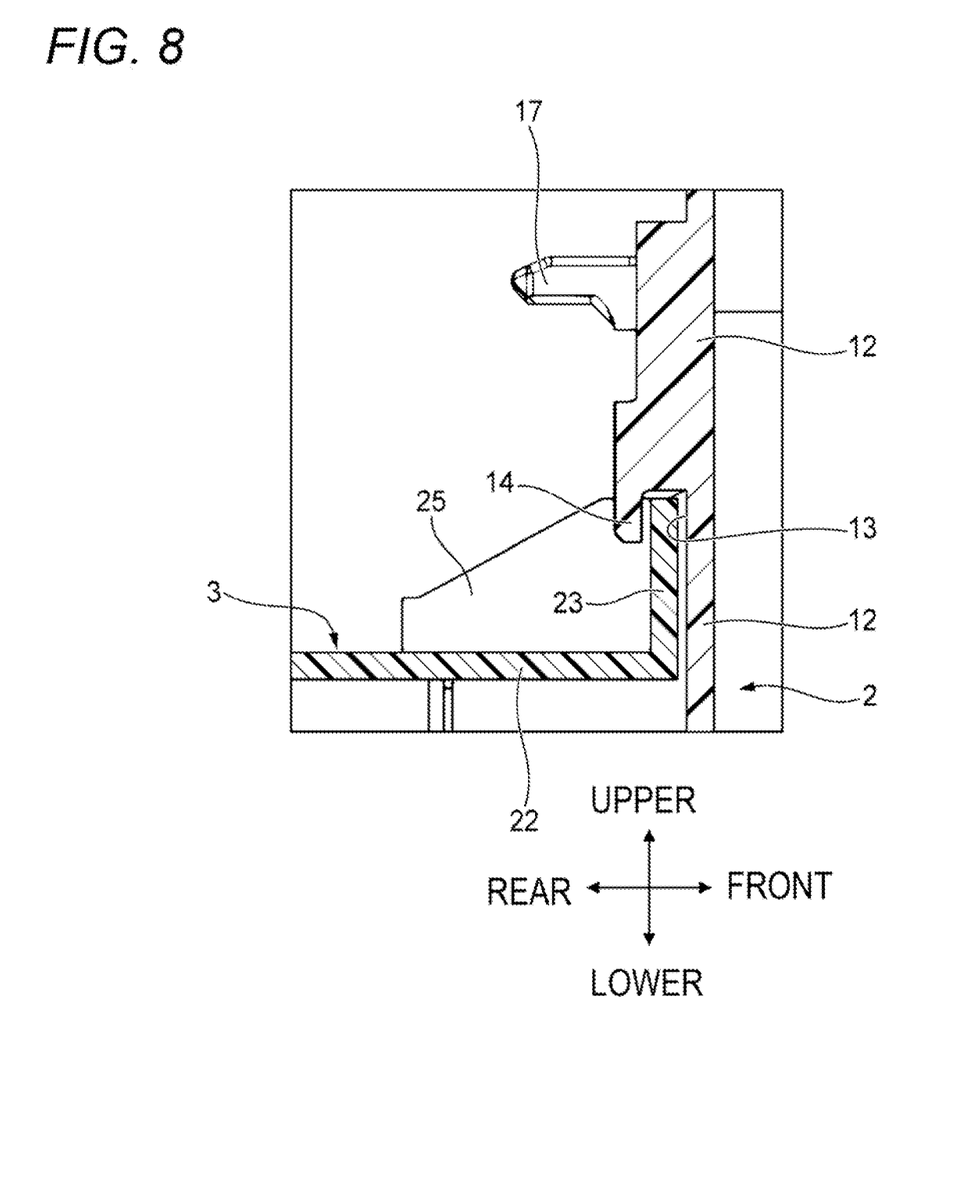
FIG. 8 is a cross-sectional view taken along the line C-C of FIG. 4 in a multilayer wall structure including a first partition wall of the body and a second partition wall of the first lid.
Figure 9:
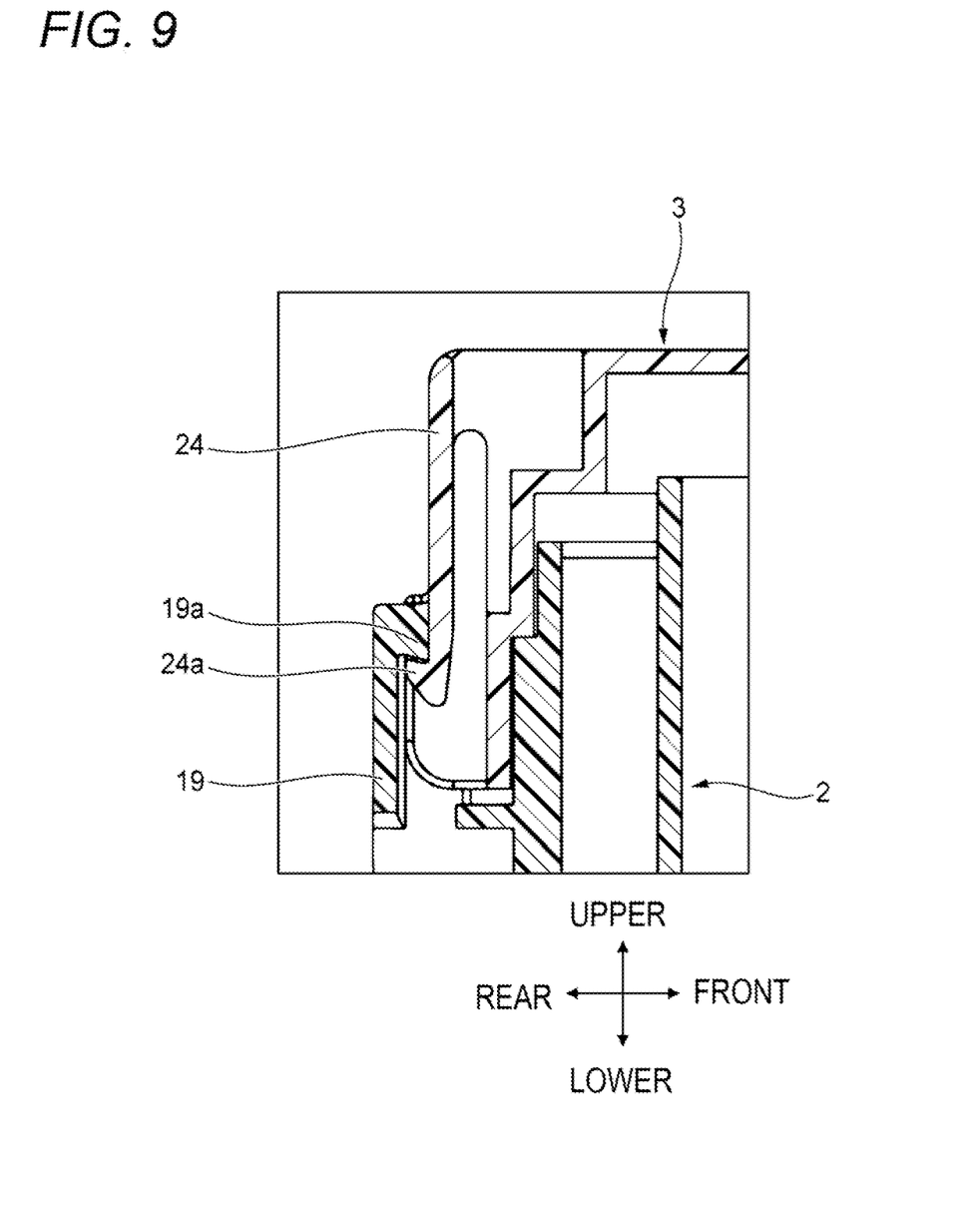
FIG. 9 is a cross-sectional view taken along the line D-D in FIG. 4 at an engagement position between an engagement portion of the body and an engagement portion of the first lid.

As shown in FIGS. 2 and 8, in a region on the rear end face of the first partition wall 12 that is below a position lower than the upper end edge by a predetermined distance, a recess, or recess-shaped restriction portion, 13 recessed forward is formed in a manner extending in a band shape in the partition direction. Locations in the vicinity of both ends of the first partition wall 12 in the partition direction (two locations) are respectively provided with ribs 14 protruding downward from the upper edge of the recess 13 (the rear end of the side wall defining the upper end of the recess 13). In the attached state of the resin structure 1, the recess 13 and the ribs 14 are engaged with the second partition wall 23 (described later) of the first lid 3 (see FIGS. 4 and 8).

Both ends of the first partition wall 12 (more specifically, the recess 13) in the partition direction are respectively formed with a pair of protrusions 15 protruding rearward and extending in the upper-lower direction (see FIG. 2, etc.). The lower ends of the pair of protrusions 15 are connected to the upper edge of the peripheral wall 11 (more specifically, the first peripheral wall 11a). The side faces of the pair of protrusions 15 on the inner side in the partition direction (a pair of side faces facing each other in the partition direction) form a pair of first inclined surfaces 16 inclined in a manner gradually approaching the outer side in the partition direction as moving rearward (toward the distal end side in the partition direction as away from the first partition wall 12)(see FIGS. 2, 5, etc.). The effect achieved by providing the pair of first inclined surfaces 16 will be described later.

As shown in FIG. 2, the rear end face of the central portion (one position) of the first partition wall 12 in the partition direction is provided with a locking projection 17 projecting rearward. In the attached state of the resin structure 1, the locking projection 17 is engaged with a lock arm (to be described later) of the second lid.

As shown in FIG. 2, a plurality of predetermined locations (two locations in the present example) in the peripheral direction of the second peripheral wall 11b are respectively provided with engagement portions 18. The plurality of engagement portions 18 are engaged with a plurality of engagement portions (described later) of the second lid. As shown in FIG. 2, a plurality of predetermined locations (two locations in the present example) in the peripheral direction of the first peripheral wall 11a are respectively provided with engagement portions 19. The plurality of engagement portions 19 are engaged with a plurality of engagement portions 24 (described later) of the first lid 3.

Next, the first lid 3 will be described. As shown in FIG. 2, the first lid 3 integrally includes a peripheral wall 21 having a shape corresponding to the first peripheral wall 11a of the body 2 when viewed in the upper-lower direction and extending in the upper-lower direction, a top wall 22 covering an upper end opening surrounded by the peripheral wall 21, and a second partition wall 23 extending in the partition direction and protruding upward from the front end edge of the top wall 22 extending in the partition direction in correspondence with the first partition wall 12. A plurality of locations (two locations) corresponding to the plurality of engagement portions 19 of the body 2 in the peripheral direction of the peripheral wall 21 are respectively provided with engagement portions 24 that can be engaged with the engagement portions 19.

Both ends of the second partition wall 23 in the partition direction are respectively formed with a pair of inclined walls 25 in correspondence with the pair of protrusions 15 of the body 2 (see FIG. 2, etc.). The pair of inclined walls 25 are inclined from both ends in the partition direction of the second partition wall 23 in a manner gradually approaching the outer side in the partition direction as moving rearward (toward the distal end side in the partition direction as away from the second partition wall 23), and extend in the upper-lower direction. The side faces of the pair of inclined walls 25 on the outer side in the partition direction (the pair of side faces on the side opposite to the pair of side faces facing each other in the partition direction) are a pair of second inclined surfaces 26 inclined along the pair of first inclined surfaces 16 of the body 2 (see FIGS. 2, 5, etc.). That is, the pair of inclined surfaces 26 are inclined in a manner gradually approaching the outer side in the partition direction as moving rearward (toward the distal end side in the partition direction as away from the second partition wall 23). The lower ends of the pair of inclined walls 25 are connected to the upper surface of the top wall 22 of the first lid 3. The effect achieved by providing the pair of inclined surfaces 26 will be described later.

Next, the second lid will be described. The second lid (not shown) integrally includes a peripheral wall having a shape corresponding to the second peripheral wall 11b of the body 2 when viewed in the upper-lower direction and extending in the upper-lower direction, a third partition wall extending in the partition direction in correspondence with the first partition wall 12 in a manner connecting both ends in the peripheral direction of the peripheral wall and extending in the upper-lower direction, and a top wall portion covering the upper end opening surrounded by the peripheral wall and the third partition wall. A plurality of locations (two locations) corresponding to the plurality of engagement portions 18 of the body 2 in the peripheral direction of the peripheral wall of the second lid are respectively provided with engagement portions that can be engaged with the engagement portions 18.

A location (one location) corresponding to the locking projection 17 of the body 2 in the partition direction of the third partition wall is provided with a lock arm having a cantilever shape and extending downward from the third partition wall. The lock arm is elastically deformable in the front-rear direction within a predetermined range. The lock arm is formed with a rectangular opening penetrating in the front-rear direction. The lower edge of the opening is locked to the locking projection 17 of the body 2. The members forming the resin structure 1 have been described above.

Figure 3:
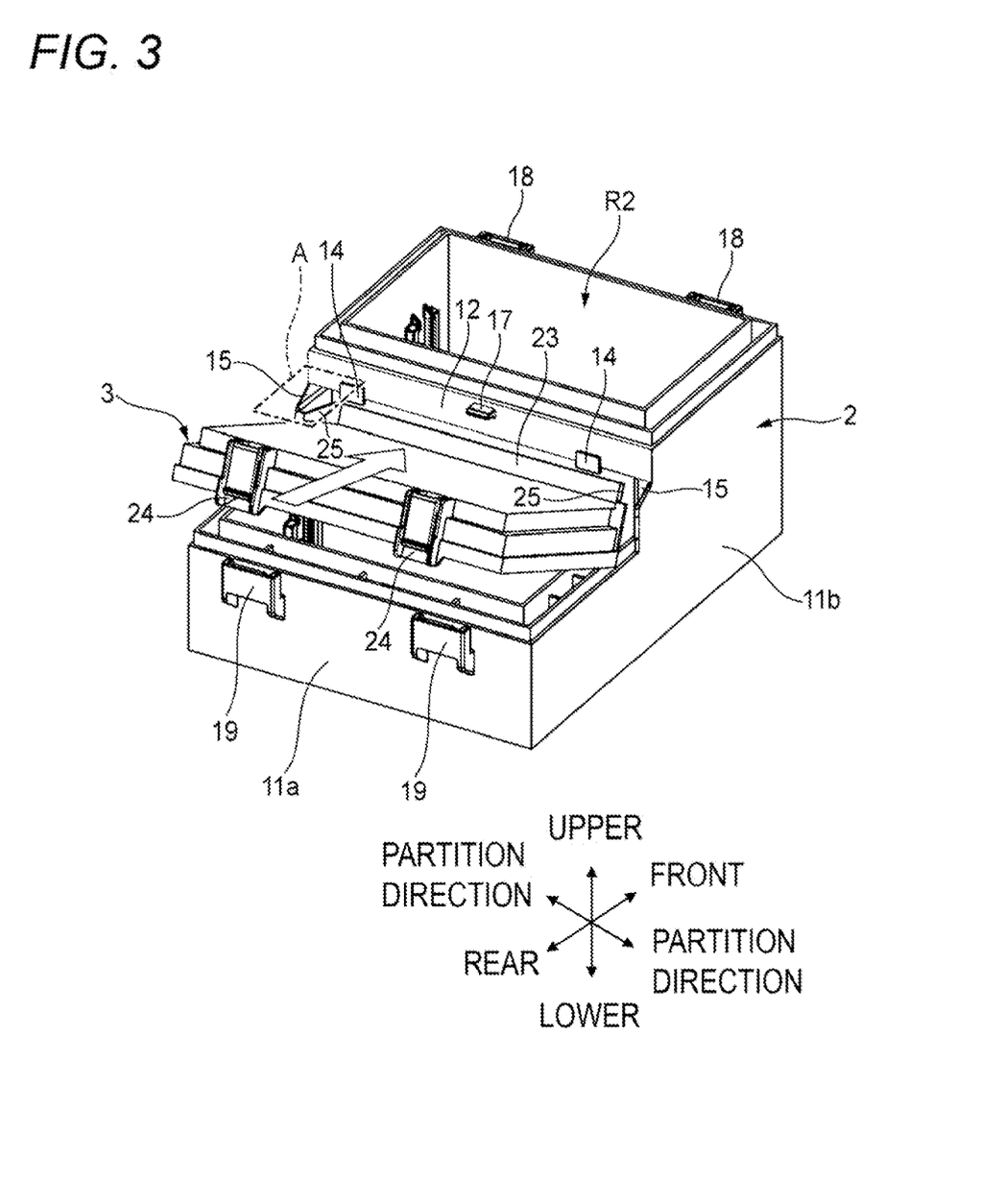
FIG. 3 is a perspective view for explaining the former half of the procedure for attaching the first lid to the body.

Next, a procedure for attaching the first lid 3 and the second lid to the body 2 will be described with reference to FIGS. 2 to 4. First, the first lid 3 is attached to the body 2. For this purpose, first, the body 2 and the first lid 3 are arranged such that the first lid 3 is positioned above the first region R1 of the body 2 (see FIG. 2). Next, as shown in FIG. 3, when inclined in an orientation such that the front end of the first lid 3 is positioned below the rear end, the upper end edge of the second partition wall 23 of the first lid 3 approaches the recess 13 of the body 2 (see the arrow in FIG. 3), the upper end edge of the second partition wall 23 is accommodated in the recess 13 such that the upper end edge of the second partition wall 23 is positioned forward of the pair of ribs 14, and then the upper end edge of the second partition wall 23 is locked to the corner on the upper side of the recess 13 (the intersecting portion between the side wall defining the upper end of the recess 13 and the bottom wall defining the front end of the recess 13) over the entire region in the partition direction (see also FIG. 8).

Here, when the first lid 3 is to be attached to the body 2, the pair of inclined walls 25 of the first lid 3 are sandwiched between the pair of protrusions 15 of the body 2 in the partition direction, and the pair of second inclined surfaces 26 of the first lid 3 are guided by facing the pair of first inclined surfaces 16 of the body 2 (see FIG. 5) to accommodate the second partition wall 23 in the recess 13. As described above, due to the guiding effect of guiding the second inclined surfaces 26 along the first inclined surfaces 16, the positional deviation of the first lid 3 with respect to the body 2 in the partition direction is prevented, and the first lid 3 is naturally disposed at the appropriate position in the partition direction for covering the first region R1.

Figure 4:
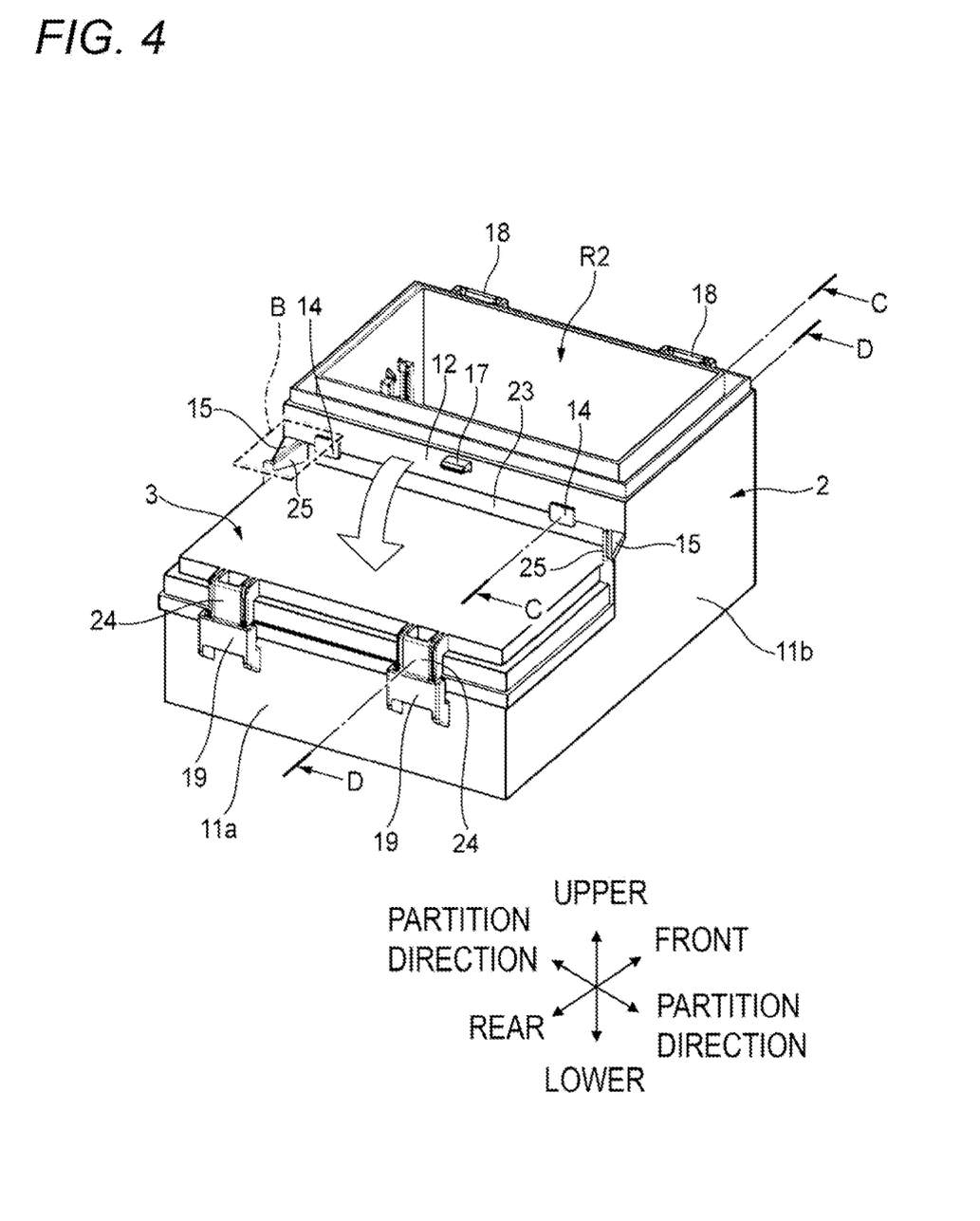
FIG. 4 is a perspective view for explaining the latter half of the procedure for attaching the first lid to the body.
Figure 5:
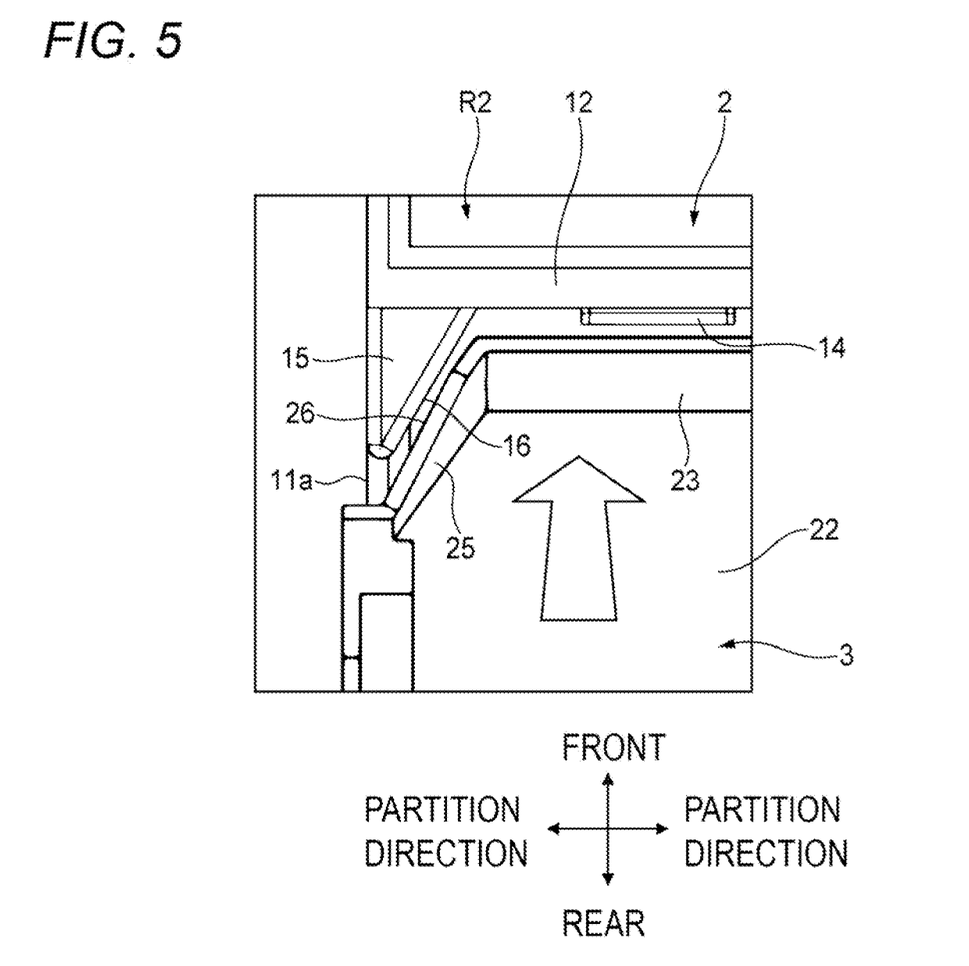
FIG. 5 is a top view of a portion A in FIG. 3.

Next, as shown in FIG. 4, the first lid 3 is rotated (see the arrow in FIG. 4) around the upper end edge of the second partition wall 23 (that is, the front end of the first lid 3) locked to the upper corner of the recess 13, in an orientation such that the rear end of the first lid 3 moves downward (the orientation such that the first lid 3 returns horizontal). Thereby, the first lid 3 is attached to the body 2 such that the peripheral wall 21 of the first lid 3 overlaps with the outside of the first peripheral wall 11a of the body 2 (see FIG. 4). Thus, the assembly of the first lid 3 to the body 2 is completed.

In a state where the assembly of the first lid 3 to the body 2 is completed, as shown in FIG. 8, the second partition wall 23 is accommodated in the recess 13. Therefore, when the upper end face of the second partition wall 23 and the inner wall surface of the side wall defining the upper end of the recess 13 are engaged with each other, the front end of the first lid 3 and the body 2 are prevented from being separated in the upper-lower direction. In other words, the front end of the first lid 3 and the body 2 are prevented from being separated in the upper-lower direction without separately providing a locking structure for fixing or the like. Further, by engaging the rear end face of the upper end edge of the second partition wall 23 and the front-end face of the rib 14, the second partition wall 23 is prevented from moving in the direction away from the first partition wall 12 (rearward). Thereby, once the body 2 and the first lid 3 are attached, the first lid 3 is more firmly prevented from being unintentionally detached from the body 2. Further, since locking portions 19a (see FIG. 9) provided in the engagement portions 19 of the body 2 and locking portions 24a (see FIG. 9) provided in the engagement portions 24 of the first lid 3 are engaged with each other (see FIGS. 1, 2, and 9), the rear end of the first lid 3 and the body 2 are prevented from being separated in the upper-lower direction.

Further, in a state where the assembly of the first lid 3 to the body 2 is completed, as shown in FIG. 8, by overlapping (laminating) the first partition wall 12 of the body 2 and the second partition wall 23 of the first lid 3 in the front-rear direction, a multilayer wall structure (specifically, a double wall structure; a so-called labyrinth structure) is formed. As a result, as compared to the case where the first partition wall 12 and the second partition wall 23 are simply attached to each other, the creeping distance is longer, and water can be prevented from entering the inside of the body 2 from between the adjacent regions R1 and R2.

Figure 6:
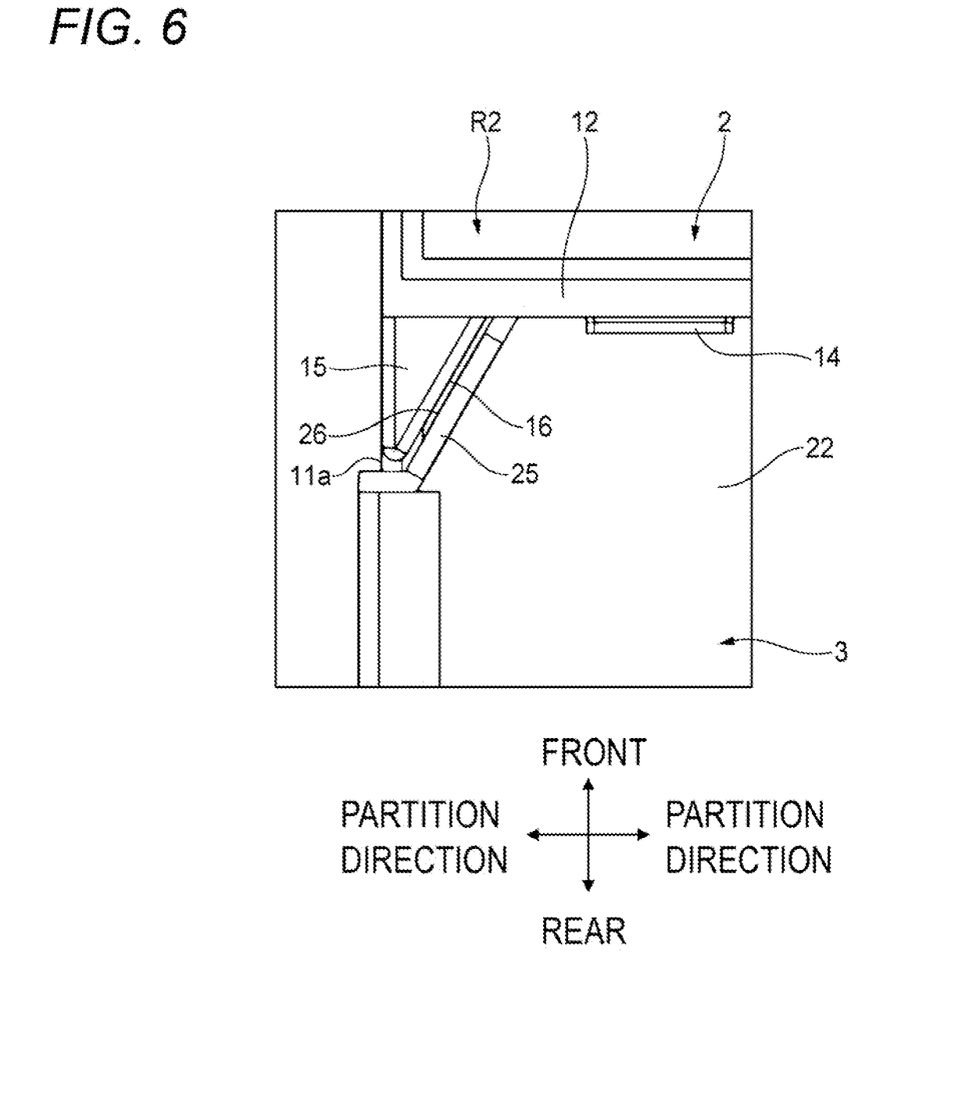
FIG. 6 is a top view of a portion B in FIG. 4.
Figure 7:
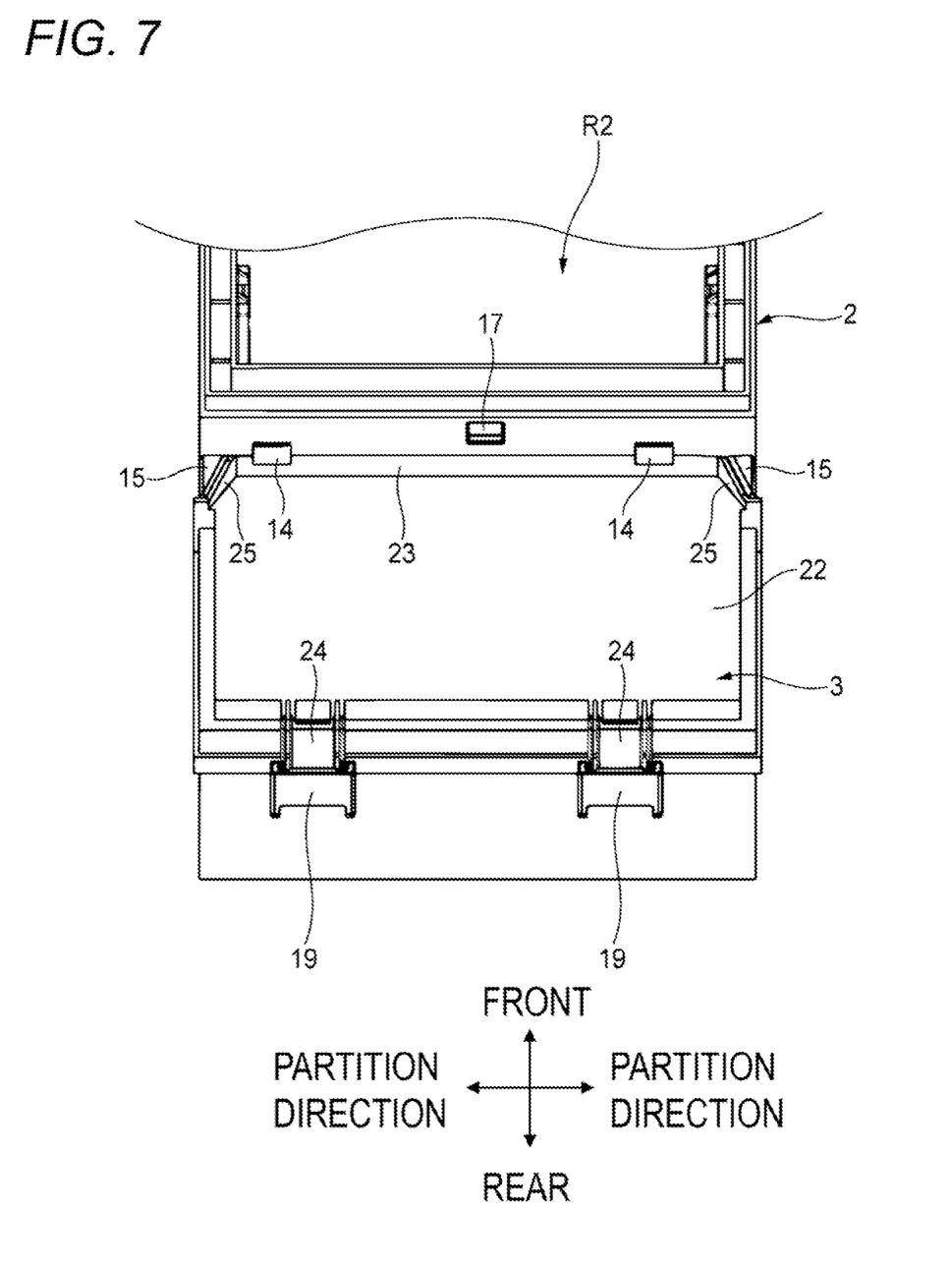
FIG. 7 is a perspective view of a part of the resin structure shown in FIG. 1 as viewed from another angle.

Further, in a state in which the assembly of the first lid 3 to the body 2 is completed, as shown in FIGS. 6 and 7, the pair of second inclined surfaces 26 are in opposite-face contact with the pair of first inclined surfaces 16 (or are arranged in a state of facing each other with a slight distance therebetween). Therefore, by visually observing the positional relationship between the pair of second inclined surfaces 26 and the pair of first inclined surfaces 16, it is possible to easily identify whether the first lid 3 is arranged at an appropriate position with respect to the body 2. In addition, since the pair of protrusions 15 projecting from the first partition wall 12 of the body 2 are coupled to the first peripheral wall 11a of the body 2, the rigidity of the body 2 per se is improved. Further, since the pair of inclined walls 25 extending from the second partition wall 23 of the first lid 3 are coupled to the top wall 22 of the first lid 3, the rigidity of the first lid 3 per se is improved. As a result, deformation of the body 2 and the first lid 3 can be prevented when the first lid 3 is to be attached to the body 2.

Next, as shown in FIG. 4, the second lid is attached to the body 2 to which the first lid 3 has been attached. For this purpose, first, the body 2 and the second lid are arranged such that the second lid is positioned above the second region R2 of the body 2. Next, the body 2 and the second lid approach each other in the upper-lower direction in a state where the second lid is kept horizontal. Thereby, the second lid is attached to the body 2 such that the third partition wall of the second lid overlaps the rear side of the first partition wall 12 of the body 2 and the peripheral wall of the second lid overlaps the outer side of the second peripheral wall 11b of the body 2. Thus, the assembly of the first lid 3 and the second lid to the body 2 is completed, and a resin structure 1 that has been completely attached is obtained.

In the state in which the assembly of the second lid to the body 2 is completed (the attached state of the resin structure 1), the lower end edge of the opening of the lock arm of the second lid and the locking projection 17 of the body 2 are engaged with each other, and the engagement portions 18 of the body 2 and the engagement portions of the second lid are engaged with each other. Thereby, the body 2 and the second lid are prevented from being separated in the upper-lower direction.

As described above, according to the resin structure 1 of the present embodiment, when the first lid 3 is to be attached to cover the region R1 among the plurality of regions R1 and R2 of the box-shaped body 2, the first lid 3 is guided such that the second inclined surfaces 26 of the first lid 3 face the first inclined surfaces 16 of the protrusions 15 protruding from the ends of the first partition wall 12 partitioning the regions R1 and R2 provided in the body 2. Here, the first inclined surfaces 16 are inclined in a manner gradually approaching the distal end side in the partition direction as away from the first partition wall 12, and the second inclined surfaces 26 are inclined along the first inclined surfaces 16. Therefore, when the first lid 3 is to be attached to the body 2, the first lid 3 is naturally arranged at the appropriate position to cover the region R1 by a guiding effect that the second inclined surfaces 26 are guided along the first inclined surfaces 16. Furthermore, since the protrusions 15 protrude from the first partition wall 12 and are coupled to the peripheral wall 11a of the region R1, the rigidity of the body 2 per se is improved. Therefore, unintended deformation of the body 2 can be prevented. The prevention of the deformation of the body 2 contributes to arranging the first lid 3 at the appropriate position. Therefore, the resin structure 1 according to the present embodiment enables the first lid 3 to be easily attached to the body 2 having the plurality of inner regions R1 and R2.

Further, both ends of the first partition wall 12 in the partition direction are provided with the above-described protrusions 15. Therefore, when the first lid 3 is to be attached to the body 2, the first lid 3 is guided to the appropriate position for covering the region R1 while being sandwiched between the two protrusions 15 in the partition direction. Therefore, the resin structure 1 according to the present embodiment enables the first lid 3 to be more easily attached to the body 2.

Further, when the first lid 3 is attached to the body 2 forming the resin structure 1, the first partition wall 12 of the body 2 and the second partition wall 23 of the first lid 3 overlap each other, so that a multilayer wall structure (so-called labyrinth structure) is formed. With this multilayer wall structure, the creeping distance between the body 2 and the first lid 3 is increased, so that it is possible to prevent water from entering the inside of the resin structure 1 from the boundary portion between the adjacent regions R1 and R2. That is, the waterproof property of the resin structure 1 can be improved.

Further, the recess 13 provided in the first partition wall 12 of the body 2 restricts the second partition wall 23 of the first lid 3 from moving in the direction away from the body 2. Therefore, for example, when the first lid 3 is to be attached to the body 2, the first lid 3 can rotate about the contact point between the recess 13 of the body 2 and the first lid 3 to be attached to the body 2. Further, since the movement of the first lid 3 is restricted by the recess 13, it is possible to prevent the first lid 3 from coming off the body 2 without separately providing a locking structure for fixing or the like. Therefore, with such a lock structure being omitted, the internal space of the body 2 is enlarged, and the storage performance of the resin structure 1 is enhanced. In addition, since there is no need to provide such a lock structure on the peripheral wall 11 of the body 2, the resin structure 1 can be reduced in size.

While the presently disclosed subject matter has been described with reference to certain exemplary embodiments thereof, the scope of the presently disclosed subject matter is not limited to the exemplary embodiments described above, and it will be understood by those skilled in the art that various changes and modifications may be made therein without departing from the scope of the presently disclosed subject matter as defined by the appended claims.

In the above embodiment, both ends of the first partition wall 12 of the body 2 in the partition direction are provided with the protrusions 15 each having the first inclined surface 16. On the other hand, one end of the first partition wall 12 of the body 2 in the partition direction may be provided with the protrusions 15 having the first inclined surface 16 alone.

According to an aspect of the embodiments described above, a resin structure (1) includes a body (2) having a box-shape and divided into a plurality of regions (R1, R2) and a lid (3) configured to be attached to the body (2) and to cover one (R1) of the plurality of regions. The body (2) includes a first partition wall (12) extending in a partition direction to partition a pair of regions (R1, R2) adjacent to each other of the plurality of regions. The lid (3) is configured to cover one (R1) of the pair of regions and includes a second partition wall (23) provided at an edge of the lid (3) in a manner extending in the partition direction along the first partition wall (12). The first partition wall (12) has a protrusion (15) provided at an end of the first partition wall (12) in the partition direction, the protrusion (15) protruding toward the second partition wall (23) and being coupled to a peripheral wall (11a) of the one (R1) of the regions, and having a first inclined surface (16) inclined in a manner gradually approaching a distal end side in the partition direction toward a distal end of the protrusion (15) away from the first partition wall (12). The second partition wall (23) has a second inclined surface (26) provided at an end of the second partition wall (23), the end corresponding to the protrusion (15) in the partition direction, the second inclined surface (26) inclined along the first inclined surface (16). When the body (2) and the lid (3) are being attached to each other, the lid (3) is attached to the body while being guided by the second inclined surface (26) facing the first inclined surface (16).

According to the resin structure having the configuration as described above, when the lid is to be attached to cover the one among the plurality of regions of the box-shaped body, the lid is guided by the second inclined surface of the lid facing the first inclined surface of the protrusion protruding from the end of the first partition wall partitioning the regions provided in the body. Here, the first inclined surface is inclined in a manner gradually approaching the distal end side in the partition direction as away from the first partition wall, and the second inclined surface is inclined along the first inclined surface. Therefore, when the lid is to be attached to the body, the lid is naturally arranged at the appropriate position to cover the region corresponding to the lid by a guiding effect that the second inclined surface is guided along the first inclined surface. Furthermore, since the protrusion protrudes from the first partition wall and is coupled to the peripheral wall of the one region, the rigidity of the body per se is improved. Therefore, unintended deformation of the body can be prevented. The prevention of the deformation of the body contributes to arranging the lid at the appropriate position. Therefore, the resin structure having the configuration enables the lid to be easily attached to the body having the plurality of inner regions.

The first partition wall (12) may have the protrusion (15) at both ends of the first partition wall (12) in the partition direction.

With this configuration, both ends of the first partition wall in the partition direction are provided with the above-described protrusion. Therefore, when the lid is to be attached to the body, the lid is guided to the appropriate position for covering the region corresponding to the lid while being sandwiched between the two protrusions in the partition direction. Therefore, the resin structure having the present configuration enables the lid to be more easily attached to the body.

When the body (2) and the lid (3) are attached to each other, the first partition wall (12) and the second partition wall (23) may be arranged to overlap with each other in a thickness direction of the first partition wall (12) to form a multilayer wall structure.

According to the resin structure having the configuration of the above [3], when the lid is attached to the body forming the resin structure, the first partition wall of the body and the second partition wall of the lid overlap each other, so that a multilayer wall structure (so-called labyrinth structure) is formed. With this multilayer wall structure, the creeping distance between the body and the lid is increased, so that it is possible to prevent water from entering the inside of the resin structure from the boundary portion between the adjacent regions. That is, the waterproof property of the resin structure can be improved.

The first partition wall (12) may have a recess-shaped restriction portion (13) configured to accommodate at least a part of the second partition wall (23) and to restrict the second partition wall (23) from moving in a direction away from the body (2).

According to the resin structure having the configuration of the above [4], the recess-shaped restriction portion provided in the first partition wall of the body restricts the second partition wall of the lid from moving in the direction away from the body. Therefore, for example, when the lid is to be attached to the body, the lid can rotate about the contact point between the restriction portion of the body and the lid to be attached to the body. Further, since the movement of the lid is restricted by the restriction portion, it is possible to prevent the lid from coming off the body without separately providing a locking structure for fixing or the like. Therefore, with such a lock structure being omitted, the internal space of the body is enlarged, and the storage performance of the resin structure is enhanced. In addition, since there is no need to provide such a lock structure on the peripheral wall of the body, the resin structure can be reduced in size.

What is claimed is:

1. A resin structure comprising:
   a body having a box-shape and divided into a plurality of regions; and
   a lid configured to be attached to the body and to cover one of the plurality of regions,
   wherein the body includes a first partition wall extending in a partition direction to partition a pair of regions adjacent to each other of the plurality of regions,
   wherein the lid is configured to cover one of the pair of regions and includes a second partition wall provided at an edge of the lid in a manner extending in the partition direction along the first partition wall,
   wherein the first partition wall has;
      a protrusion protruding therefrom provided at an end of the first partition wall in the partition direction, the protrusion protruding toward the second partition wall and being coupled to a peripheral wall of the one of the regions, and having a first inclined surface inclined with respect to a top view of the body in a manner gradually approaching a distal end side in the partition direction toward a distal end of the protrusion away from the first partition wall, and
      a recess-shaped restriction portion provided at a middle part of the first partition wall along the partition direction and being recessed in an upper direction with respect to a side view of the body, the recess-shaped restriction portion being configured to accommodate at least a part of the second partition wall and to restrict the second partition wall from moving in a direction away from the body,
   wherein the second partition wall has:
      a second inclined surface provided at an end of the second partition wall, the end corresponding to the protrusion in the partition direction, the second inclined surface being inclined with respect to a top view of the lid along the first inclined surface, and
      an upper end protruding upward from a surface of the lid with respect to a side view of the lid and configured to be accommodated in the recess-shaped restriction portion of the first partition wall, and
   wherein, when the body and the lid are being attached to each other, the lid is attached to the body while being guided by the second inclined surface facing the first inclined surface.

2. The resin structure according to claim 1, wherein the first partition wall has the protrusion at both ends of the first partition wall in the partition direction.

3. The resin structure according to claim 1, wherein, when the body and the lid are attached to each other, the first partition wall and the second partition wall are arranged to overlap with each other in a thickness direction of the first partition wall to form a multilayer wall structure.

4. The structure according to claim 1, wherein, when the body and the lid are being attached to each other, the lid is attached to the body while being guided by the second inclined surface facing the first inclined surface and while the upper end is rotatably inserted into the recess-shaped restriction portion.

5. The structure according to claim 1, wherein the first partition wall has ribs protruding downward from the end of the first partition wall with respect to the side view of the body and defining sides of the recess-shaped restriction portion.

* * * * *